(12) United States Patent
Pei

(10) Patent No.: US 8,555,806 B2
(45) Date of Patent: Oct. 15, 2013

(54) APPARATUS FOR MAKING ELECTRODE OF DYE-SENSITIZED SOLAR CELL IN ONE WORKING STATION

(75) Inventor: Shao-Kai Pei, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 208 days.

(21) Appl. No.: 13/207,443

(22) Filed: Aug. 11, 2011

(65) Prior Publication Data

US 2012/0312229 A1    Dec. 13, 2012

(30) Foreign Application Priority Data

Jun. 7, 2011 (TW) .................................. 100119810

(51) Int. Cl.
| | | |
|---|---|---|
| *B05C 3/02* | (2006.01) | |
| *B05C 19/02* | (2006.01) | |
| *B05C 5/00* | (2006.01) | |
| *B05B 17/00* | (2006.01) | |
| *B05D 1/18* | (2006.01) | |

(52) U.S. Cl.
USPC ........... 118/423; 118/404; 118/500; 118/304; 427/97.9; 427/99.5; 427/601; 427/434.7; 438/753

(58) Field of Classification Search
USPC ................. 118/56, 400, 423, 429, DIG. 12, 118/DIG. 19, 100, 110, 313–315, 304, 500, 118/52, 319, 320, 404; 427/430.1, 99.5, 427/97.9, 169, 428.2, 434.7
See application file for complete search history.

(56) References Cited

U.S. PATENT DOCUMENTS

| | | | |
|---|---|---|---|
| 3,023,599 A * | 3/1962 | Pellegrini ........................ 68/213 |
| 5,460,859 A * | 10/1995 | Reale .............................. 427/560 |
| 5,792,259 A * | 8/1998 | Yoshioka et al. ............... 118/52 |
| 6,224,670 B1 * | 5/2001 | Ishida .............................. 118/70 |
| 7,033,463 B1 * | 4/2006 | Hongo et al. ................... 204/198 |
| 7,779,780 B2 * | 8/2010 | Yoshioka et al. .............. 118/400 |
| 2002/0150832 A1 * | 10/2002 | Kinoshita et al. ............. 430/133 |
| 2003/0134048 A1 * | 7/2003 | Shiotsuka et al. ............. 427/421 |
| 2003/0138565 A1 * | 7/2003 | Lewis .......................... 427/372.2 |
| 2003/0150738 A1 * | 8/2003 | Glassman ..................... 205/125 |
| 2005/0247567 A1 * | 11/2005 | Akram et al. .................. 205/145 |
| 2007/0117365 A1 * | 5/2007 | Kuriyama et al. ............ 438/597 |
| 2007/0151944 A1 | 7/2007 | Du |
| 2007/0190240 A1 * | 8/2007 | Choi et al. ..................... 427/123 |
| 2008/0182023 A1 * | 7/2008 | Spohn et al. .............. 427/255.28 |
| 2008/0247847 A1 * | 10/2008 | Muller et al. .............. 414/222.01 |
| 2008/0271989 A1 * | 11/2008 | Shoji et al. ................ 204/192.13 |
| 2009/0283031 A1 * | 11/2009 | Grasso .......................... 118/104 |

(Continued)

*Primary Examiner* — Yewebdar T. Tadesse
*Assistant Examiner* — Karl Kurple
(74) *Attorney, Agent, or Firm* — Altis & Wispro Law Group, Inc.

(57) ABSTRACT

An apparatus for making an electrode of a dye-sensitized solar cell, includes a dye container, a number of nozzles, a roller and a number of holders. The dye container has a chamber for receiving a dye material, and the chamber has a top wall and a number of through holes formed through the top wall. The nozzles each have an opening facing toward a substrate to be formed into the electrode and configured for jetting a working material to the substrate. The roller rolls the working material on the substrate. The holders are rotatably mounted on the top wall and each hold a corresponding substrate to first receive the working material and then to be submerged into the dye material through one of the through holes of the dye container by rotation, thereby obtaining the electrode of a dye-sensitized solar cell.

5 Claims, 6 Drawing Sheets

(56) References Cited

U.S. PATENT DOCUMENTS

| | | | |
|---|---|---|---|
| 2010/0068404 A1* | 3/2010 | Wang et al. | 427/430.1 |
| 2010/0083899 A1* | 4/2010 | Hung et al. | 118/713 |
| 2011/0011335 A1* | 1/2011 | Thie et al. | 118/58 |
| 2011/0076412 A1* | 3/2011 | Schieszer | 427/440 |
| 2011/0308455 A1* | 12/2011 | Choi et al. | 118/708 |
| 2011/0318493 A1* | 12/2011 | Wu et al. | 427/314 |
| 2012/0006261 A1* | 1/2012 | Nishihara et al. | 118/426 |
| 2012/0132134 A1* | 5/2012 | Hsu et al. | 118/64 |

* cited by examiner

APPARATUS FOR MAKING ELECTRODE OF DYE-SENSITIZED SOLAR CELL IN ONE WORKING STATION

BACKGROUND

1. Technical Field

The present disclosure relates to electrodes of dye-sensitized solar cells, and particularly to an apparatus for making an electrode of a dye-sensitized solar cell.

2. Description of Related Art

Dye-sensitized solar cells are widely used for converting solar power into electrical power. A typical dye-sensitized solar cell includes a working electrode, a counter electrode and an electrolyte sandwiched between the working electrode and the counter electrode. The counter electrode usually has a catalytic material, such as platinum (Pt) or carbon (C). The working electrode may have a substrate, and a working material and a dye material coated on the substrate. The working material usually may be $TiO_2$ or ZnO. The dye material converts solar power into electrical power through oxidation-reduction reaction in the solar cell.

The working electrode needs a working material coating and a dye material coating, so a production line, which has a plurality of working stations is usually used to make the working electrode. However, the production line is too long, and contamination may occur between alternations of the working stations.

What is needed, therefore, is an apparatus for making an electrode of a dye-sensitized solar cell, which can overcome the above shortcomings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
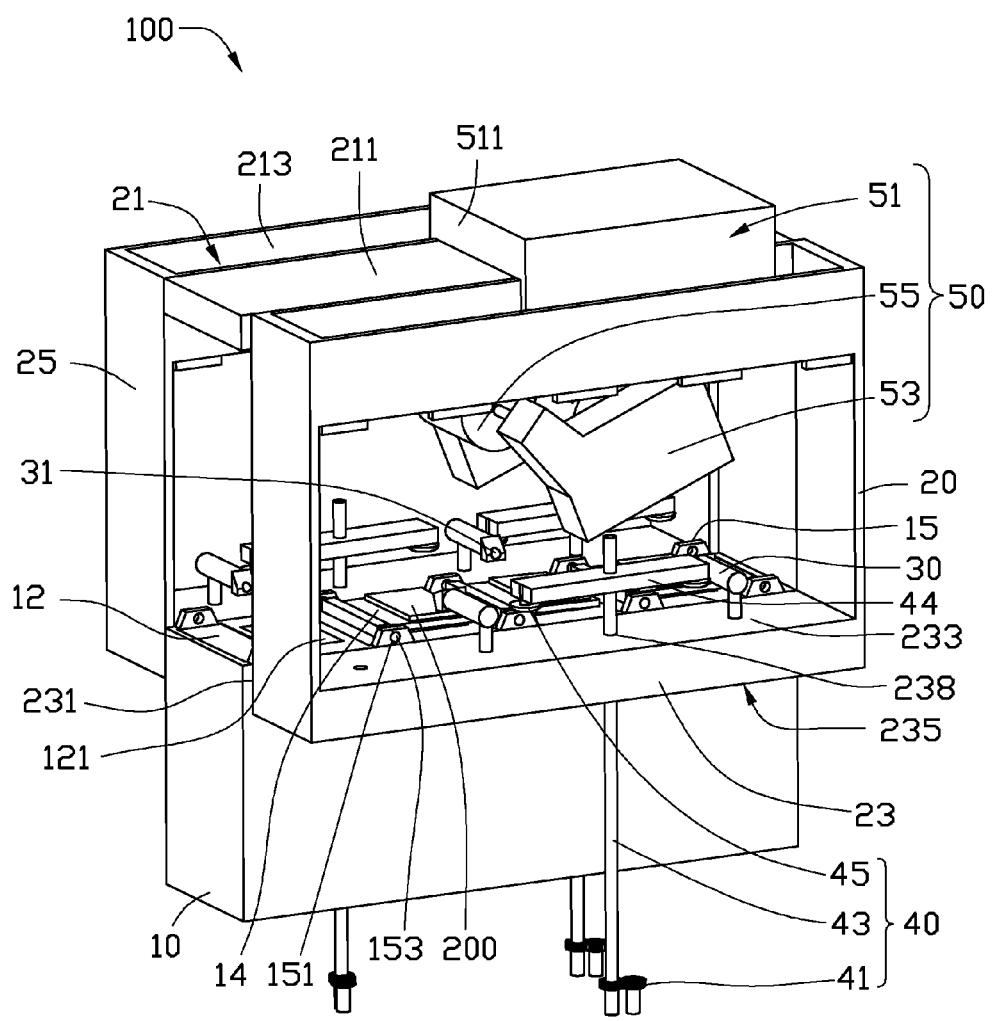
FIG. 1 is a schematic isometric view of an apparatus for making an electrode of a dye-sensitized solar cell in accordance with an embodiment.
Figure 2:
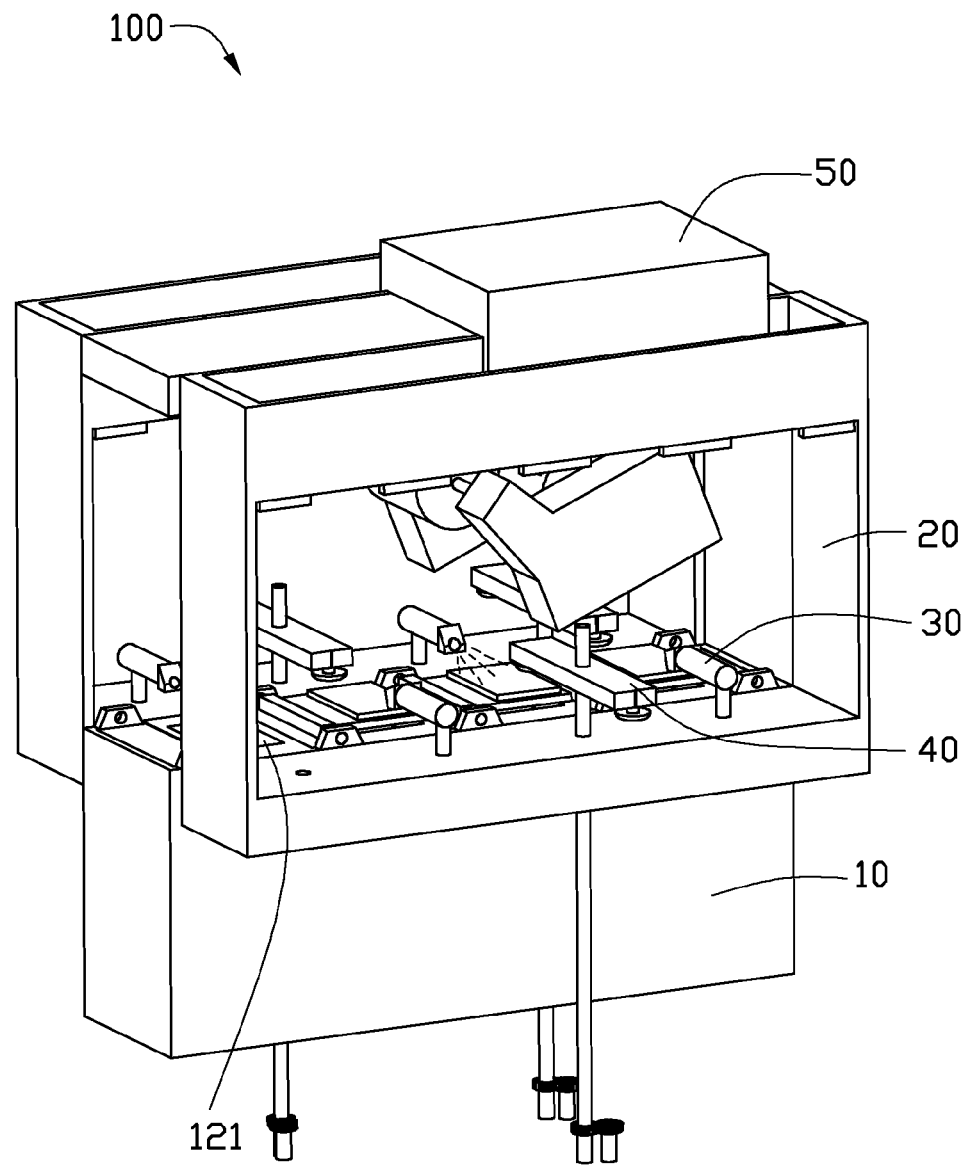
FIG. 2 is similar to FIG. 1, but shows the apparatus in a working state.
Figure 3:
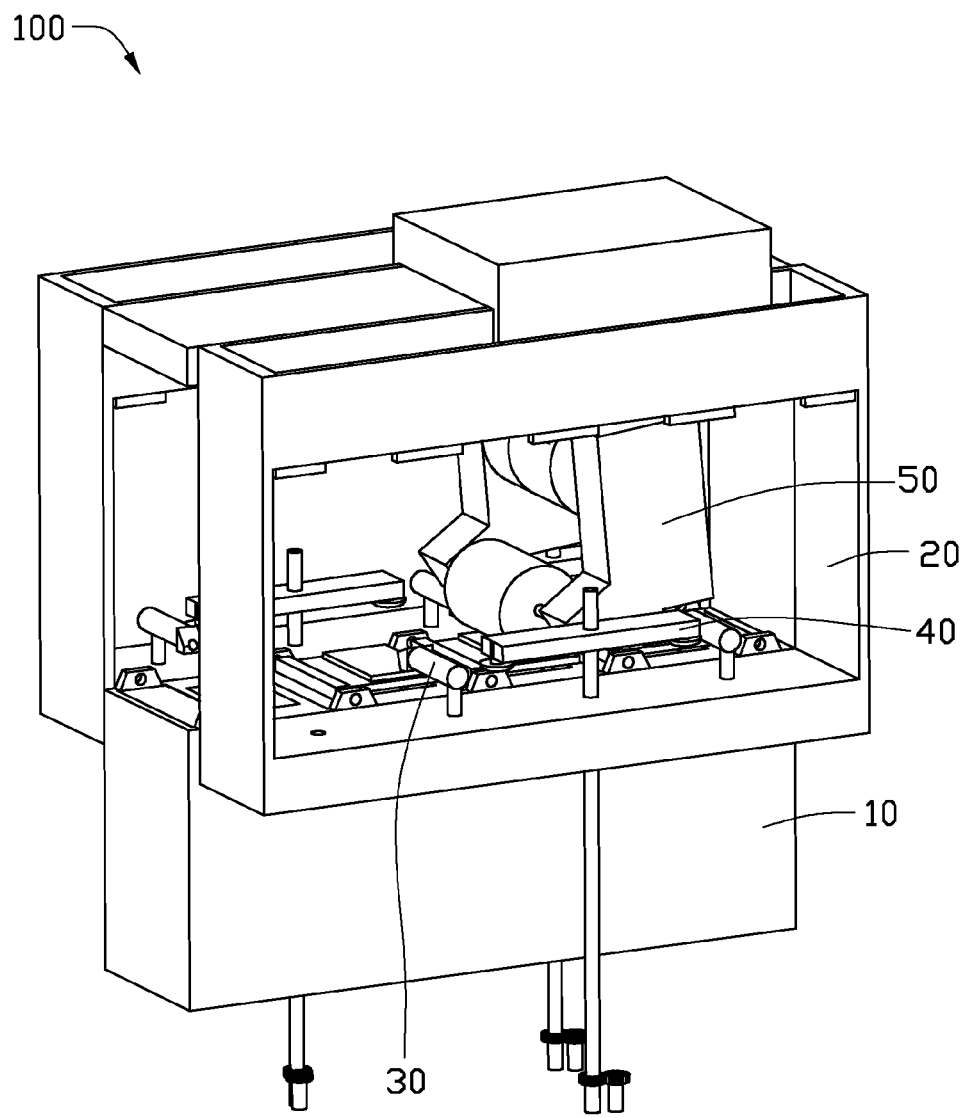
FIG. 3 is similar to FIG. 1, but shows the apparatus in another working state.
Figure 4:
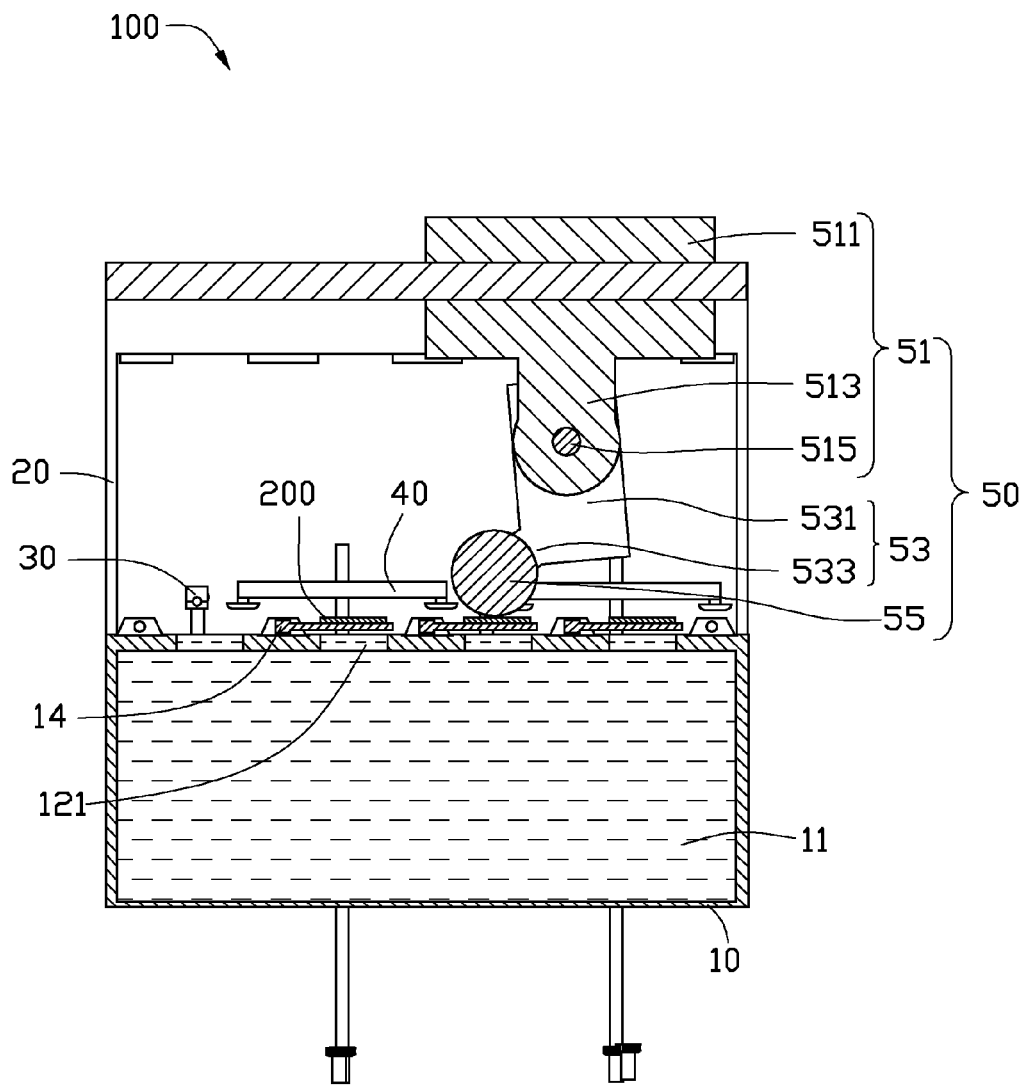
FIG. 4 is a cross sectional view of the apparatus of FIG. 3.

Embodiments of the present apparatus will now be described in detail below and with reference to the drawings.

Referring to FIGS. 1 to 4, an apparatus 100 for making a working electrode of a dye-sensitized solar cell (DSSC) is shown. The apparatus 100 includes a dye container 10, a plurality of holders 14, a holding frame 20, a plurality of nozzles 30, a pick up tool 40 and a rolling mechanism 50.

The dye container 10 has a chamber 11 (see FIG. 4) containing photosensitive dye. In the present embodiment, the photosensitive dye is ruthenium polypyridyl complex. The dye container 10 is substantially rectangular shape, and includes a top wall 12. The top wall 12 has a plurality of through holes 121 in communication with the chamber 11. In the present embodiment, four through holes 121 are defined in the top wall 12, and an area of each of the through holes 121 is greater than that of a substrate 200 to be made into the electrode. The chamber 11 is filled with a dye used in the DSSC.

Figure 5:
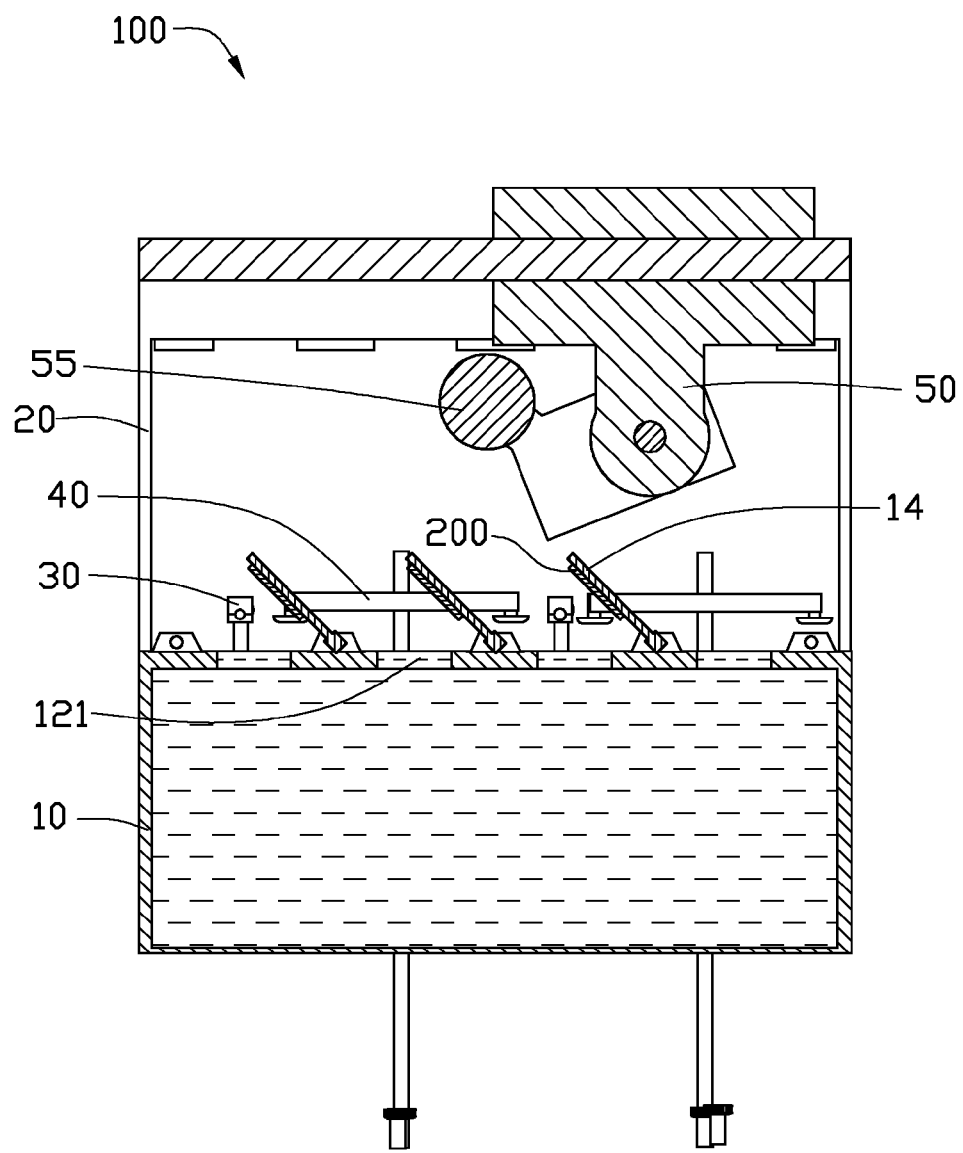
FIG. 5 is similar to FIG. 4, but shows the rolling is finished, and the substrate is rotated by a driving device.

The holders 14 are rotatably mounted on the top wall 12 of the dye container 10 (see FIG. 5). Each of the holders 14 holds the substrate 200. The holders 14 can be mounted by adhesive that cannot react with the dye, by vacuum suction, or by other mechanisms. In the present embodiment, the top wall 12 has a plurality of pairs of lugs 15 formed thereon, each of the holders 14 is substantially in a plate shape, and has two shafts 151 formed at opposite sides. The two shafts 151 extend through the pair of lugs 15 and are driven to rotate by a third driving device 153 mounted on the top wall 12, such that the holder 14 is rotatable relative to the top wall 12.

A heating device (not shown) can be mounted on the top wall 12 to heat the substrate 200 after a material is applied to the substrate 200.

The holding frame 20 is mounted on the dye container 10, and includes a top plate 21, a bottom plate 23 and a plurality of side plates 25 interconnecting the top plate 21 and the bottom plate 23. The top plate 21 has a rail 211 formed thereon, and two grooves 213 are defined at opposite sides of the rail 211. A slit 231 is defined in the bottom plate 23, exposed to the sidewalls 25 at opposite sides. The dye container 10 is inserted in the slit 231 and is connected to the bottom plate 23 at the slit 231. The bottom plate 23 has a first surface 233 facing toward the top plate 21, and an opposite second surface 235. The first surface 233 can be coplanar with the top wall 12 of the dye container 10, or a little higher than the top wall 12. A plurality of through holes 238 are further defined in the bottom plate 23 through the first surface 233 and a second surface 235.

The nozzles 30 each have a first end fixed on the first surface 233 of the bottom plate 23, and an opposite second end facing toward the substrate 200 on the holder 14. The nozzles 30 jet a working solution at the substrates 200. In the present embodiment, the nozzles 30 are used for jetting $TiO_2$ solution. An opening 31 is defined in the second end, and is slanted relative to the top wall 12 of the dye container 10.

The pick up tool 40 includes a first driving device 41, a vertical transmission shaft 43, a horizontal transmission shaft 44 and two pick up devices 45. The vertical transmission shaft 43 is connected to the first driving device 41, and is driven to rotate with the first driving device 41. The vertical transmission shaft 43 extends through one of the through holes 238 of the bottom plate 23, and is rotatable relative to the through hole 238. The horizontal transmission shaft 44 is fixed on the vertical transmission shaft 43 above the first surface 233 of the bottom plate 23, and rotates with the vertical transmission shaft 43. The pick up devices 45 are fixed on opposite ends of the horizontal transmission shaft 44, and face toward the first surface 233. By rotation of the horizontal transmission shaft 44, the pick up devices 45 can be aligned with the holders 14. In the present embodiment, the pick up devices 45 are vacuum suction devices.

Figure 6:
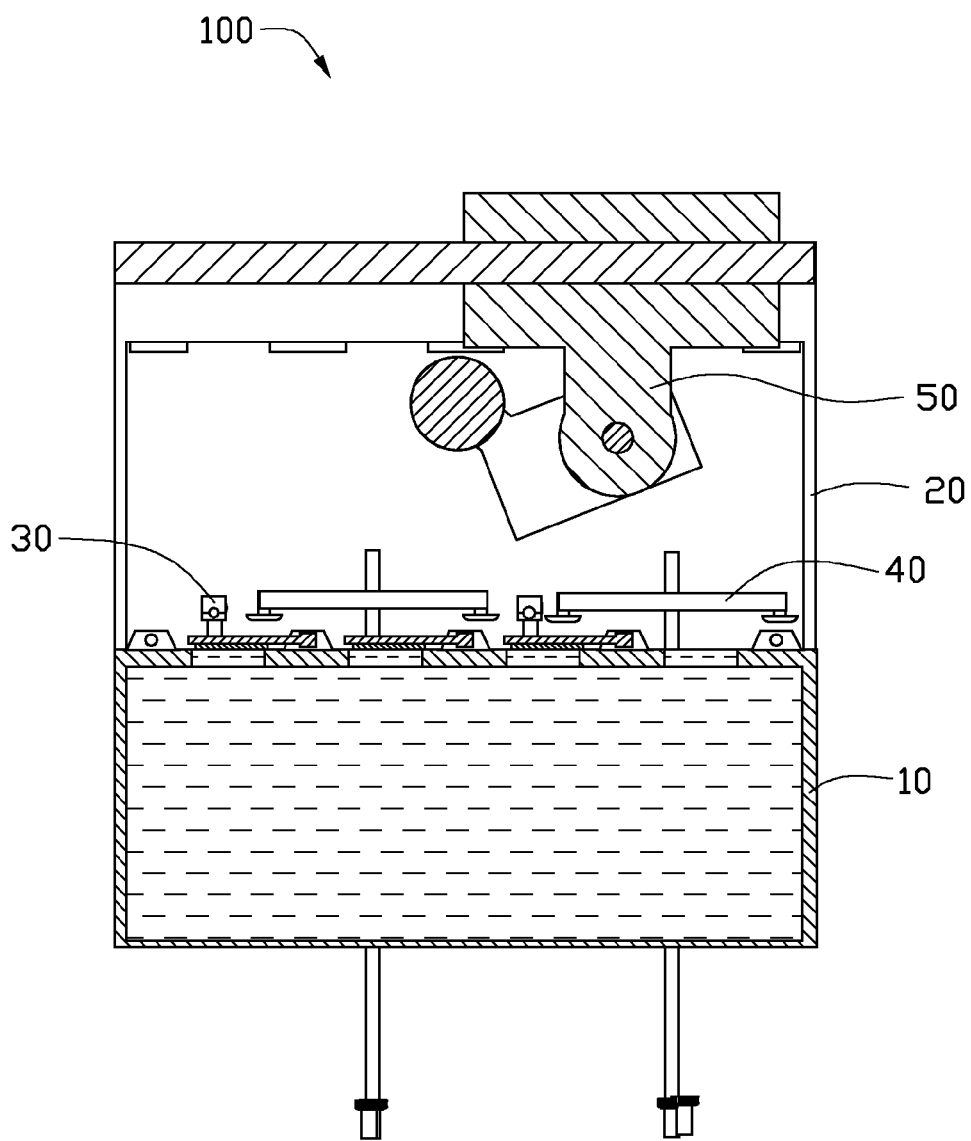
FIG. 6 is similar to FIG. 5, but shows the substrate is rotated to face the through hole of the chamber.

Referring also to FIGS. 5 and 6, the rolling mechanism 50 is used to roll the material applied to the substrate 200. The rolling mechanism 50 includes a second driving device 51, two connection portions 53 and a roller 55. The connection portions 53 are pivotably connected to the second driving device 51 and can rotate relative to the second driving device 51. The roller 55 is pivotably connected to the connection portions 53. In the present embodiment, the second driving device 51 includes a driving portion 511 and two coupling portions 513. The driving portion 511 slidably mounted on the rail 211 along a lengthwise direction of the rail 211. The coupling portions 513 extend from opposite sides of the driving portion 511, and are received in the grooves 213, respectively. The connection portions 53 each are pivotably connected to the coupling portions 513 by a shaft 515. Each of the connection portions 53 includes a first end 531 adjacent to the corresponding shaft 515, and a second end 533 away from the shaft 515. The roller 55 has a mandrel 551 that is extending out of the two ends, and fixed on the shafts 515. The roller 55 can rotate with the mandrel 551.

The first driving device 41, the second driving device 51, and the third driving device 153 can be controlled by a same controller.

In application, the substrate 200 to be treated is picked up by one of the pick up devices 45, which can be rotated to be aligned with the holder 14 under the driving force of the first driving device 41, the substrate 200 can be placed on the holder 14 by control of the vacuum. Then the nozzle 30 jets a $TiO_2$ working solution to the substrate 200 (see FIG. 2). After that, the driving force of the second driving device 51 rotates the shaft 515, such that the connection portions 53 can also rotate, and thus the roller 55 can be lowered down to the substrate 200 to roll the working solution evenly (see FIGS. 3 and 4). At this time, a heating device can be initiated to heat the substrate 200 to evaporate the solvent in the working solution.

Next, the third driving device 153 drives the holders 14 to rotate 180 degrees, such that the substrate 200 faces the through hole 121 and can be submerged into the dye in the chamber 11 through the through hole 121 (see FIGS. 5 and 6). The submergence lasts several hours to allow the dye to sensitize the substrate 200 with the $TiO_2$ coating, and thereby a working electrode of a DSSC is obtained.

The apparatus 100 is compact for preparing the working electrode, which is also more automatic and thus can reduce pollution. The apparatus 100A can work continuously for making a plurality of the working electrodes, which obtains a high efficiency.

It is understood that the above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. An apparatus for making an electrode of a dye-sensitized solar cell, the apparatus comprising:
    a dye container having a chamber containing a dye material, the chamber having a top wall and a plurality of through holes formed through the top wall;
    a plurality of holders rotatably mounted on the top wall, the holders configured to hold a plurality of substrates;
    a plurality of nozzles each having an opening configured to jet a working material onto a respective one of the substrates; and
    a roller configured to apply and spread the working material over each of the substrates;
    the holders configured to hold and rotate the substrates 180 degrees between first positions where the substrates lie on the holders to receive the working material jetted by the nozzles, and second positions where the substrates are rotated upside down relative to the first positions and submerged into the dye material in the through holes thereby obtaining dye-sensitized solar cell electrodes.

2. The apparatus of claim 1, further comprising a rail arranged above the dye container and a driving device slidably mounted on the rail, the holders aligned along the rail, the roller being pivotably connected to the driving device.

3. The apparatus of claim 1, wherein each holder comprises a vacuum suction device configured to hold a respective one of the substrates by suction.

4. The apparatus of claim 1, wherein the through holes are shaped and sized in a manner such that the substrates are passable therethrough.

5. The apparatus of claim 1, wherein the nozzles are configured to jet the working material onto the substrates in an oblique direction relative to the substrates.

* * * * *